United States Patent [19]

Yoshimoto

[11] Patent Number: 4,606,013

[45] Date of Patent: Aug. 12, 1986

[54] REDUNDANCY-SECURED SEMICONDUCTOR MEMORY

[75] Inventor: Masahiko Yoshimoto, Takarazuka, Japan

[73] Assignee: Mitsubishi Denki Kabushiki Kaisha, Tokyo, Japan

[21] Appl. No.: 579,604

[22] Filed: Feb. 13, 1984

[30] Foreign Application Priority Data

Feb. 17, 1983 [JP] Japan ................................. 58-26463

[51] Int. Cl.$^4$ ............................................ G11C 11/40
[52] U.S. Cl. ..................................... 365/200; 365/96
[58] Field of Search ......................... 365/200, 96, 204; 371/10, 8

[56] References Cited

U.S. PATENT DOCUMENTS 3,765,002 10/1973 Basse ................................... 365/204
4,459,685 7/1984 Sud et al. ............................. 371/10

OTHER PUBLICATIONS

Schuster, "On-Chip Redundancy Scheme", IBM Technical Disclosure Bulletin, vol. 14, No. 5, Oct. 1971, pp. 1513-1514.
Tolley et al., "72K RAM Stands Up to Hard and Soft Errors", Electronics, vol. 55, No. 12, Jun. 16, 1982, pp. 147-151.
Fitzgerald et al., "Circuit Implementation of Fusible Redundant Addresses on RAMs for Productivity Enhancement", IBM Journal of Research Development, vol. 24, No. 3, May 1980, pp. 291-298.

Primary Examiner—James W. Moffitt
Assistant Examiner—Glenn A. Gossage
Attorney, Agent, or Firm—Birch, Stewart, Kolasch & Birch

[57] ABSTRACT

A redundancy-secured semiconductor memory including a matrix of regular memory cells consisting of a plurality of regular memory cell trains, an extra memory cell train for redundant construction, and a taking-over system for enabling the extra memory cell train to take over the function of a faulty regular memory cell train including a faulty bit, wherein the taking-over system comprises a decoder and a monostable latching circuit connected to the decoder through a current conducting element capable of breakage in response to when one of the regular memory cell trains comes to include a faulty bit, thereby enabling the monostable latching circuit to fix its output to the low logic potential. Thus, the faulty regular memory cell train is kept in an unselected state without DC power consumption.

13 Claims, 2 Drawing Figures

REDUNDANCY-SECURED SEMICONDUCTOR MEMORY

FIELD OF THE INVENTION

The present invention relates to a redundancy-secured semiconductor memory, and more particularly, to a semiconductor memory including an extra row or column of memory cells for redundant construction. More specifically, the present invention is concerned with improvements in a system for taking over a faulty bit, hereinafter referred to as the "taking-over system".

BACKGROUND OF THE INVENTION

In general, as the capacity of a semiconductor memory increases, the chip size becomes enlarged and the memory cell pattern has a higher density. In such situations, malfunctions are more likely to arise because of faulty bits, and the resulting yield is reduced. To overcome this problem, the common practice is to provide an extra row or column of memory cells in the semiconductor memory chip beforehand, and enable the extra row or column to take over for the row or column including a faulty bit. In this case, it is previously programmed so that a laser blowing occurs in the fuse so as to break the circuit in response to the occurrence of a fault on a bit.

Under the conventional practice mentioned above, it is necessary to ensure that when a regular memory cell column or row train is found to include a faulty bit, the regular memory cell train is electrically separated from the regular decoder, and then, the node thereof separated from the regular decoder which has been a terminal for an input signal to be applied to is fixed at the low logic level (hereinafter referred to as the "L" level). This means that the faulty regular memory cell train is kept at an unselected state, wherein the "faulty regular memory cell train" means a regular memory cell train including a faulty bit. This terminology will ensue in the following description.

For better understanding, reference will be more particularly made to FIG. 1, which shows a structural view of a known taking-over system:

The illustrated example is concerned with a regular selecting means for selecting a regular memory cell column train in a static RAM (random access memory). There are provided a decoder 1 for decoding an input address signal, the output 2 of which is connected to gates 11, 12 of MOS (metal oxide semiconductor) transistors 9, 10 through a fuse 3 of polisilicon, which is programmed to be melted or blown by a laser or similar means. The MOS transistors 9 and 10 for selecting a desired column are located in the regular memory cell column train 31 including regular memory cells in each column. There is provided an element of high resistance 4 connected between the gates 11, 12 and the ground, which element is made of polysilicon. The drains or sources of the MOS transistors 9, 10 are connected to bit lines 7, 8, respectively, and their sources (or drains) are connected to I/O (input/output) lines 5 and 6, respectively.

The system is operated as follows:

So long as the regular memory cell column train 31 is safe from a faulty bit, the fuse 3 allows a current to flow in a regular manner, thereby maintaining that the output 2 of the decoder 1 is connected to the gates 11, 12 of MOS transistors 9, 10, respectively. When the decoder output 2 is stepped up to a high logic level (hereinafter referred to as the "H" level), the MOS transistors 9, 10 turn on, thereby connecting the bit lines 7, 8 to the I/O lines 5, 6. In this way the stored information is read out.

On the other hand when the regular memory cell column train 31 includes a faulty bit, the fuse 3 is melted by a laser in accordance with the programmed instruction, thereby electrically disconnecting the decoder output 2 from the gates 11, 12 of the MOS transistors 9, 10. The electric charges at the gates 11, 12 are discharged to the ground through the element of high resistance 4, and the potentials of the gates 11, 12 are changed to the ground potential. In this way the MOS transistors 9, 10 are cut off, and the bit lines 7, 8 are electrically disconnected from the I/O lines 5, 6. As a result, the regular memory cell column train 31 illustrated in FIG. 1 is made ineffective on the read/write operation of the memory.

Meanwhile, in the extra memory cell group an extra selecting means starts to work so as to enable an extra memory cell column train to take over the faulty regular memory cell column train in accordance with the programmed instruction. That is, in the situation that the faulty regular memory cell column train 31 are disconnected from the I/O line, the extra selecting means for selecting an extra memory cell column train starts to work upon receipt of an address input signal which would otherwise be applied to the regular selecting means for selecting regular memory cell column train, thereby enabling the extra memory cell column train to take over the faulty regular memory cell column train.

As evident from the foregoing description, it is essential under the conventional practice to provide an element of high resistance 4 so as to keep the column train including a faulty memory cell in an unseleced state. In general, an element of high resistance is made of polysilicon or any other material of high resistance. In a full CMOS memory, in which a P-channel MOS transistor is employed for a load transistor, it is particularly necessary to fabricate such a resistance of polysilicon, a process which involves an extremely complicated processing steps. This results in the increased production cost.

OBJECTS AND SUMMARY OF THE INVENTION

The present invention aims at solving the difficulties pointed out above with respect to the conventional practice, and has for its object to provide a redundancy-secured semiconductor memory of simplified construction without the use of any element of high resistance.

Another object of the present invention is to provide a redundancy-secured semiconductor memory capable of production by simplified processing steps, thereby reducing the production cost to a greater extent.

Another object of the present invention is to provide a redundancy-secured semiconductor memory with the taking-over system which consumes no DC power. This advantage is suitable to a design of the full CMOS memory.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to the present invention, there is provided a redundancy-secured semiconductor memory including a matrix of regular memory cells consisting of a plurality of regular memory cell trains, an extra memory cell train for redundant construction, and a taking-over system for enabling said extra memory cell train to take over a faulty regular memory cell train including a faulty bit, wherein the taking-over system comprises:

a first means for selecting one from said regular memory cell trains;

a second means for selecting one from said extra memory cell, train or trains, the selected extra memory cell train being used to replace a faulty regular memory cell train;

said first selecting means including a decoder, and a current conducting means breakable when one of said regular memory cell trains comes to include a faulty bit, thereby disconnecting the output of said decoder from said faulty regular memory cell train; and a monostable latching means connected to said decoder through said current conducting means, the monostable latching means being adapted to output a signal in response to the breakage of said current conducting means, whereby said faulty regular memory cell train is kept in an unselected state.

DETAILED DESCRIPTION OF THE INVENTION

Figure 1:
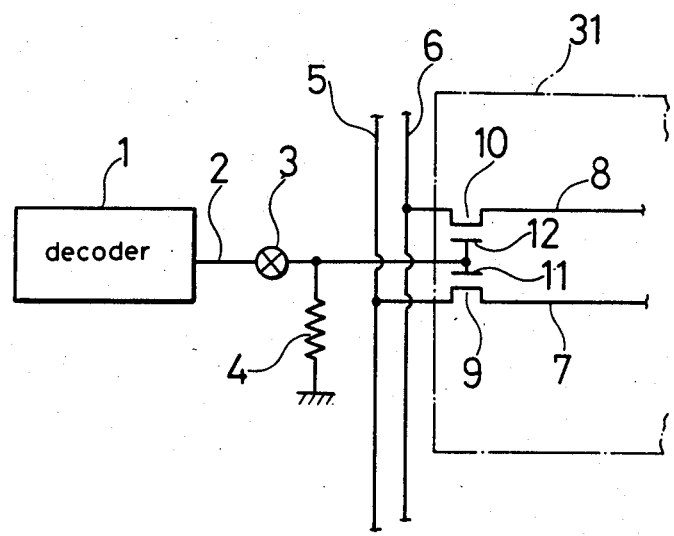
FIG. 1 is a circuit diagram of a known redundancy-secured semiconductor memory.
Figure 2:
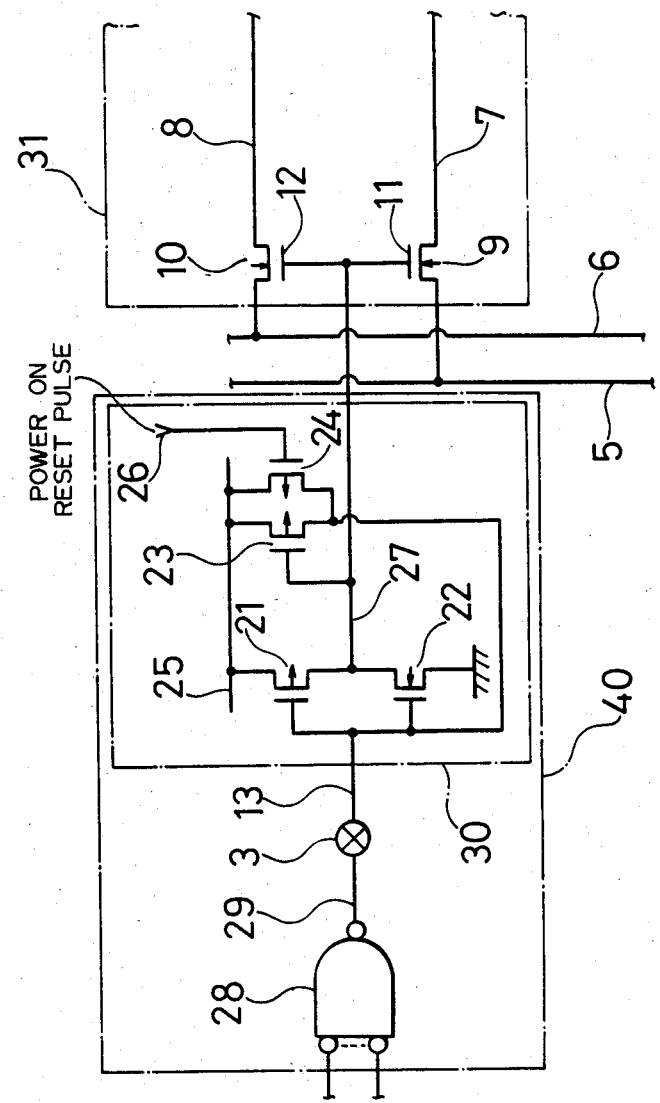
FIG. 2 is a circuit diagram of a redundancy-secured semiconductor memory embodying the present invention.

Referring to FIG. 2, where like reference numerals are used to designate like elements or parts to those in FIG. 1, to which reference has been already made to explain the Background of the Invention.

There is provided a NAND decoder 28, whose output 29 is connected to a monostable latch 30 through a link fuse 3. The output of the monostable latch 30 is connected to the gates 11 and 12 of MOS transistors 9 and 10 located in the regular memory cell column train 31. The drains (or sources) of the MOS transistors 9 and 10 are connected to the bit lines 7 and 8, respectively, and their sources (or drains) are connected to the I/O lines 5 and 6, respectively.

The monostable latch 30 has a structure in which a CMOS inverter is constructed with a P-channel MOS transistor 21 and an N-channel MOS transistor 22, which are connected in series to each other between a power supply 25 and the ground. There are provided further P-channel MOS transistors 23 and 24, whose sources are connected to the power supply 25, and whose drains are connected to the input terminal 13 of the CMOS inverter. In addition, the gate of the P-channel MOS transistor 23 is connected to the output terminal 27 of the CMOS inverter. The gate of the P-channel MOS transistor 24 is connected to a terminal 26 such that a power-on reset pulse is impressed across the gate therethrough when the power is applied.

The taking-over system 40 is constructed with the NAND decoder 28, the link fuse 3, and the monostable latch 30.

The taking-over system 40 is operated as follows:

When the regular memory cell column train 31 has no faulty bit, no laser blowing occurs on the link fuse 3, thereby maintaining that the output 29 of the NAND decoder 28 is connected to the input terminal 13 of the CMOS inverter. In this situation the monostable latch 30 is driven by the NAND decoder 28, and functions as an inverter, thereby transmitting decoded signals to each gates 11, 12 of the MOS transistors 9 and 10. In this way the regular memory operation is conducted. More particularly, when the output 29 of the NAND decoder 28 is at the "L" level, the output 27 of the monostable latch 30 rises to the "H" level, thereby allowing the MOS transistors 9 and 10 to be on. As a result, the bit lines 7 and 8 are connected to the I/O lines 5 and 6, respectively. Thus the stored information is read out.

In contrast, if the regular memory cell column train 31 comes to include a faulty bit, the link fuse 3 is blown by a laser, thereby insulating the output 29 of the NAND decoder 28 from the monostable latch 30. The output 27 of the monostable latch 30 keeps at its "L" level. This is because of the fact that when the power is applied, the P-channel MOS transistor 24 is turned on upon receipt of the power-on reset pulse at its gate from the terminal 26, thereby charging up the input terminal 13 of the CMOS inverter up to the "H" level, setting the output 27 of the monostable latch 30 to the "L" level. This state is continued after removal of the power-on reset pulse as the "0" level is applied to the gate of P-channel MOS transistor 23, thereby holding the input terminal 13 of the CMOS inverter up to the "H" level, without DC power consumption. As a result, the MOS transistor 9 and 10 are cut off, thereby electrically separating the bit lines 7 and 8 from the I/O lines 5 and 6, respectively. In this way the faulty memory cell column train 31 is made quite ineffective on the read/write operation of the memory. At the same time the extra memory cell column train (not shown) is selected in accordance with the programmed instruction, and takes over the function of the faulty regular memory cell column train 31. As described above, the programmed instruction is that when a fault occurs on a bit in the regular memory cell column train 31, the extra selecting means for selecting an extra memory cell column train starts to work upon receipt of an address input signal which would otherwise be applied to the regular selecting means for selecting regular memory cell column train, the fuse 3 is broken by a laser blowing, thereby enabling the extra memory cell column train to take over the faulty regular memory cell column train.

The foregoing description has been given with respect to the columns, but of course the present invention can be applied to the rows. The monostable latch is constructed with a CMOS device, but it is not limited to it. For example, an NMOS (N-channel MOS) device can be effectively employed. In addition, the polysilicon fuse, which is broken by a laser blowing, can be effectively replaced by an electric fuse, which is melted by a current flow. Alternatively, a polysilicon fuse breakable by laser annealing can be used.

What is claimed is:

1. A redundancy-secured semiconductor memory including a matrix of regular memory cells consisting of a plurality of regular memory cell trains, an extra memory cell train for redundant construction, and a taking-over system for enabling said extra memory cell train to take over the function of a faulty regular memory cell train including a faulty bit, wherein said taking-over system comprises:

first means for selecting one from said regular memory cell trains;
second means for selecting, a said extra memory cell train said selected extra memory cell train replacing a said faulty regular memory cell train;
said first selecting means including,
a decoder decoding an input address signal, and
a selectively breakable current conducting means connected to said decoder for disconnecting said faulty regular memory cell train, thereby disconnecting the output of said decoder from said faulty regular memory cell train; and
monostable latching means connected between said current conducting means and said selected one from said regular memory cell train, said monostable latching means developing a signal when said current conducting means is disconnected, whereby said faulty regular memory cell train is kept in an unselected state, said monostable latching means functioning as a driver between said decoder and said selected one of said regular memory cell trains when said current conducting means is not disconnected.

2. A redundancy-secured semiconductor memory as set forth in claim 1, wherein said current conducting means comprises a polysilicon fuse capable of being severed by a laser.

3. A redundancy-secured semiconductor memory including a matrix of regular memory cells arranged in regular memory cell columns and at least one redundant memory cell column to replace a regular memory cell column determined to be faulty,
address decoder means for supplying an address signal to an input of a corresponding said regular memory cell column;
selectively disconnectable current conducting means connected to said address decoder means for selectively disconnecting said address signal from said corresponding memory cell column when a said regular memory cell within said corresponding memory cell column is determined faulty;
monostable latching means, connected between said selectively disconnectable current conducting means and said corresponding regular memory cell column, for functioning as an address signal driver when said current conducting means is not disconnected and for maintaing said corresponding regular memory cell columns in an unselected state when said current conducting means is disconnected.

4. The memory of claim 3 wherein said monostable latching means maintains said corresponding memory cell columns in an unselected state by clamping said input thereof to a low voltage.

5. The memory of claim 4 wherein said monostable latching means comprises:
an inverter;
means for supplying a high voltage to the input of said inverter.

6. The memory of claim 5 wherein said means for supplying comprises:
first switch means for connecting the input of said inverter to a source of high voltage in response to receipt of a power ON reset pulse at a control terminal thereof.

7. The memory of claim 6 wherein said means for supplying further comprises:
second switch means for connecting the input of said inverter to said source of high voltage in response to the development of a low voltage applied to a control terminal of said second switch means, said control terminal being connected to the output of said inverter.

8. The memory of claim 7 wherein said second switch means comprises a P-channel MOS transistor.

9. The memory of claim 8 wherein said first switch means comprises a P-channel MOS transistor.

10. The memory of claim 7 wherein said current conducting means comprises a fuse.

11. The memory of claim 10 wherein said current conducting means comprises a fuse.

12. The memory of claim 3 wherein said current conducting means comprises a fuse.

13. The memory of claim 12 wherein said fuse is constructed of polysilicon and is severed by application of laser energy thereto.

* * * * *